United States Patent [19]

Laikhtman

[11] Patent Number: 4,993,035
[45] Date of Patent: Feb. 12, 1991

[54] HIGH POWER SEMICONDUCTOR LASER USING OPTICAL INTEGRATED CIRCUIT

[76] Inventor: Boris Laikhtman, 26 Spring St., Mount Kisco, N.Y. 10549

[21] Appl. No.: 332,786

[22] Filed: Apr. 3, 1989

[51] Int. Cl.[5] .............................................. H01S 3/19
[52] U.S. Cl. ........................................ 372/50; 372/44; 372/108; 350/96.12; 350/96.19
[58] Field of Search ................... 372/50, 44, 107, 108, 372/102, 105; 350/96.12, 96.15, 96.17, 96.19, 96.29, 96.3; 357/19

[56] References Cited

U.S. PATENT DOCUMENTS 4,286,838 9/1981 Huignard et al. .................... 372/50
4,786,132 11/1988 Gorden ............................. 350/96.19

FOREIGN PATENT DOCUMENTS 0202581 11/1983 Japan .................................... 372/50
0188967 10/1984 Japan .................................... 357/19

Primary Examiner—Georgia Epps

[57] ABSTRACT

A semiconductor laser device which operates stably at high power in the lowest order lateral mode is disclosed. Stable operation in the lowest order lateral mode is achieved by coupling the laser to a particular resonant mode of a Fabry-Perot resonator oriented perpendicular to the laser. Coupling between the laser and the resonator is illustratively achieved through use of an optical integrated circuit comprising two grating structures oriented orthogonally to each other.

16 Claims, 3 Drawing Sheets

HIGH POWER SEMICONDUCTOR LASER USING OPTICAL INTEGRATED CIRCUIT

FIELD OF THE INVENTION

The present invention relates to a high power, fundamental mode, double-heterostructure semiconductor laser which emits a collimated beam through use of a passive optical integrated circuit.

BACKGROUND OF THE INVENTION

The advantages of semiconductor lasers are the direct and highly efficient conversion of electric power into coherent light, compactness, and the capability of direct power and frequency modulation. However, in contrast to other types of lasers (for example, gas lasers or YAG: Nd lasers), semiconductor lasers do not provide a collimated beam without complex optical focusing systems.

Typically, a semiconductor laser is formed as a double heterostructure. (see e.g., Botez "Laser Diodes are Power Packed" IEEE Spectrum June 1985 pp. 43-53) The double-heterostructure semiconductor laser comprises a semiconductor body having first and second relatively wide hand-gap cladding layers of opposite conductivity type, and a relatively narrow bandgap active layer which is located between the cladding layers. The layers are grown on a suitable substrate. Illustratively, the narrow bandgap active layer comprises GaAs and the wide bandgap cladding layers comprise $Al_x Ga_{1-x} As$ where x is about 0.35. The substrate is GaAs. Generally, electrical contacts are provided on the top and bottom surfaces of the semiconductor body comprising the laser so that the resulting diode structure can be forward biased.

When the structure is forward biased, electrons and holes from the cladding layers are injected into the active layer where radiative recombination takes place. The radiation occurs within a wavelength band determined by the bandgap of the active layer. Normally, the active layer is highly absorbing. However when a feedback mechanism is present, lasing takes place. Typically, the feedback is provided by making the end facets of the laser at least partially reflecting. In this case, radiation emitted in the active layer travels back and forth between the partially reflecting end facets of the semiconductor body. As the forward bias pumping current is increased, absorption is diminished and is replaced by amplification. Lasing begins when the round trip optical gain exceeds losses due to mechanisms such as absorbtion, scattering, and facet transmission.

In alternative lasers, structures other than reflecting end facets may be used to supply the necessary feedback. For example, a distributed Bragg reflector located outside the semiconductor body may be utilized to supply feedback. (see e.g. Olsson et al "Performance Characteristics of a 1.5 μm Single-Frequency Semiconductor Laser with an External Waveguide Bragg Reflector", IEEE Journal of Quantum Electronics Vol. 24, No. 2, February 1988 pp. 143-147; Olsson et al "Narrow Linewidth 1.5 μm Semiconductor Laser With a Resonant Optical Reflector" Applied Physics Letters Vol. 51, No. 15, Oct. 12, 1987, pp. 1141-1142; Kazarinov et al "The Relation of Line Narrowing and Chirp Reduction Resulting from the Coupling of a Semiconductor Laser to a Passive Resonator" IEEE Journal of Quantum Electronics, Vol. QE-23, No. 9, September 1987 pp. 1401-1409)

In a double-heterostructure laser structure, the index of refraction of the active layer is larger than the index of refraction of the surrounding cladding layers. Thus, the emitted radiation is transversely confined in a one-dimensional dielectric waveguide formed by the two cladding layers and the active layer. For devices with active layers thinner than about 0.3 micrometers, the arrangement is such that only the fundamental transverse mode is supported. (As used herein, transverse means perpendicular to the plane of the layers comprising the laser).

While the light is guided in the lowest order mode in the transverse direction, such is not normally the case in the lateral direction (i.e. in the plane of the layers). If a relatively wide stripe contact is used to inject the pumping current, the optical output exhibits unstable multimode behavior in the lateral direction. This unstable behavior is exaggerated as one goes to higher and higher power. Thus, such wide stripe structures, although they can produce the desired high power, have heretofore proven unsuitable for use in the typical applications contemplated for high power semiconductor diode lasers, which applications require a single stable lowest order mode optical beam.

Various techniques have been developed to provide for the confinement of emitted radiation in the lateral direction so as to achieve stable and reliable laser operation in the lowest order lateral mode. The simplest technique involves use of a narrow stripe contact on the upper surface of the semiconductor body forming the laser. In this case, the profile of injected carriers forms a weak waveguide which provides some guiding in the lateral direction. This type of laser is known as a gain guided laser. A narrow stripe gain-guided laser structure exhibits unstable multibeam behavior at high power. Other techniques for achieving confinement of emitted radiation in the lateral direction involve the formation of complex dielectric waveguide structures in the lateral direction. This type of laser is known as an index guided laser. An example of an index guided laser is the Buried-Heterostructure laser. Besides their complex fabrication procedures, a further weakness of such index guided lasers is that the power output of such lasers is severely limited because a power output density in excess of 6 to 9 mw per square micrometer at an emitting facet causes the facet to be damaged and the laser performance to degrade.

Other attempts to achieve high power fundamental lateral mode laser operation involve the phase synchronization of laser arrays (see e.g., D. R. Scifers et al., "High Power Plasma Array Lasers" Proc. of Eighth IEEE International Semiconductor Laser Conference (1982), Ottawa pp.22-23) and the use of a conventional spatial filter. Both of these approaches produce highly asymmetrical elliptic beams.

In view of the foregoing, it is an object of the present invention to provide a semiconductor structure (a) which operates in the fundamental lateral mode at high power, (b) which operates at a single frequency, and which c) provides a highly collimated and symmetrical output beam.

SUMMARY OF THE INVENTION

In accordance with the present invention, high power fundamental lateral mode operation is achieved in a double heterostructure semiconductor laser by coupling the semiconductor laser to an optical integrated circuit (OIC). The optical integrated circuit comprises a guiding layer and two grating structures oriented orthogonally to each other. The grating structures serve to couple the laser to a particular resonant mode of a Fabry-Perot resonator oriented perpendicular to the plane of the active layer in the laser so that the laser is forced to operate stably in the lowest order lateral mode due to the selectively high feedback for this mode.

DETAILED DESCRIPTION OF THE INVENTION

Figure 1:
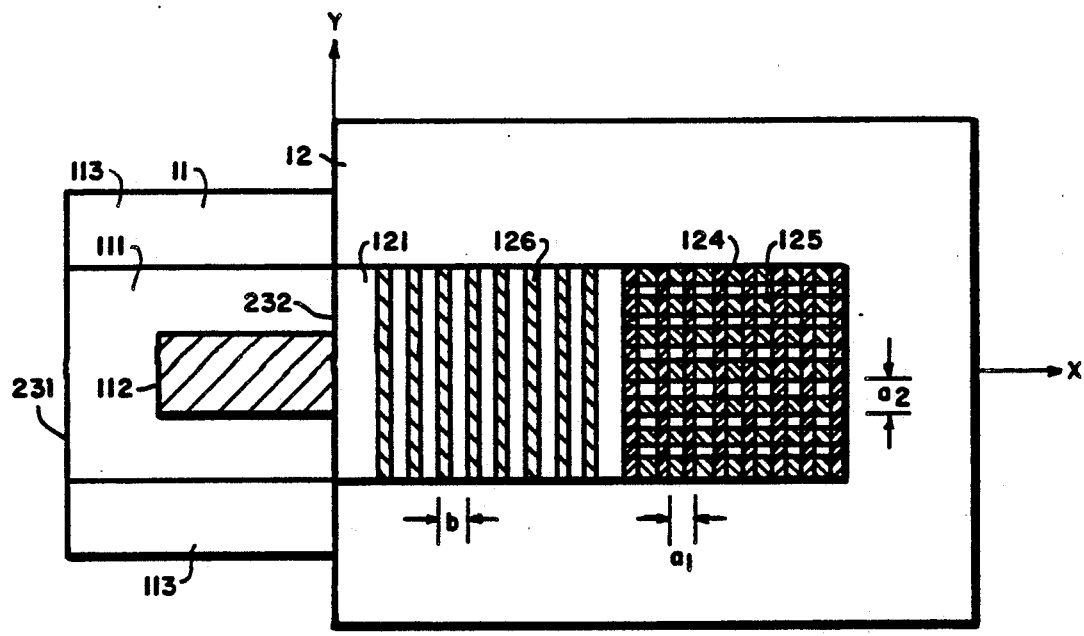
FIG. 1 shows a semiconductor laser in combination with an optical integrated circuit for achieving stable fundamental lateral mode laser operation at high power, in accordance with an illustrative embodiment of the present invention.
Figure 2:
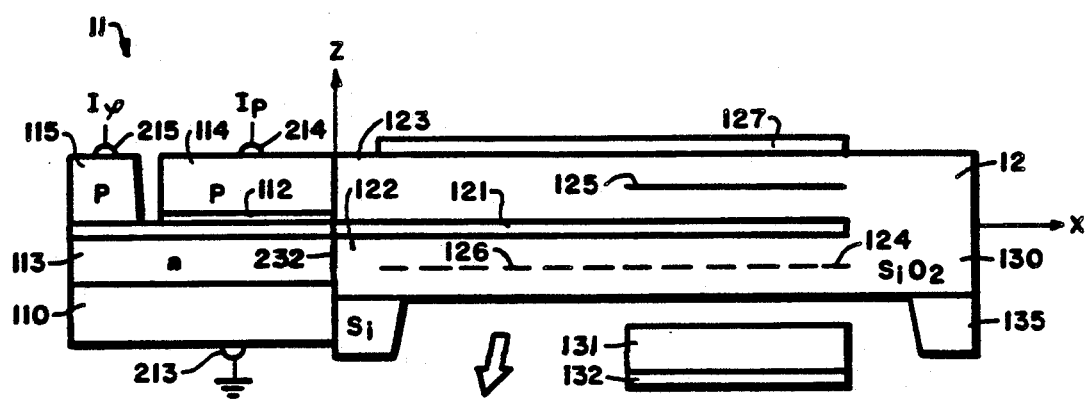
FIG. 2 shows a cross-section of the device of FIG. 1 taken along the X-axis.
Figure 3:
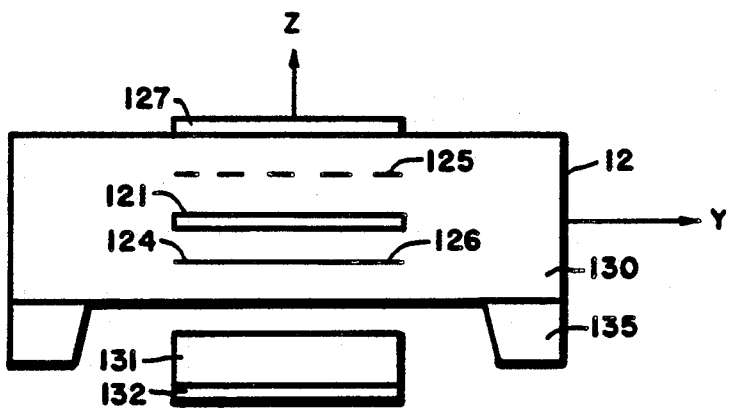
FIG. 3 shows a cross-section of the device of FIG. 1 taken along the Y axis.

To achieve stable operation of a semiconductor laser at high power in the fundamental lateral mode, a semiconductor laser is utilized in combination with an optical integrated circuit. Such a combination is illustrated in FIGS. 1, 2, and 3. In FIGS. 1, 2, and 3, a semiconductor laser is designated 11 and an optical integrated circuit is designated 12.

More particularly, the device of FIGS. 1, 2, 3 comprises a broad area double heterostructure laser 11 which is butt coupled to the optical integrated circuit 12. FIG. 2 shows a cross section of the laser 11 and the optical integrated circuit 12 taken along the X axis of FIG. 1. FIG. 3 shows a cross section of the optical integrated circuit taken along the Y-axis of FIG. 1.

Illustratively, the double heterostructure laser 11 comprises an n-type wide bandgap cladding layer 113 and a p-type wide bandgap cladding layer which is divided into portions 114 and 115. The n-type cladding layer 113 is formed on the substrate 110. Electrical contacts 214, 215 are formed on the p-type cladding layer portions 114, 115 and an electrical contact 213 is formed o the substrate 110.

The laser 11 comprises a relatively narrow bandgap active layer 112 in which radiation is emitted. A pumping current Ip is applied via the electrode 214. As a result of the pumping current, electrons and holes injected from the cladding layers 214, 215 combine in the active layer 112 to emit radiation. The laser also includes a guiding layer 111. The guiding layer has a bandgap which is in between the bandgap of the cladding layers and the bandgap of the active layer. Radiation emitted in the active layer 112 propagates within the guiding layer 111. The optical axis of the laser 11 is along the X-axis in FIGS. 1, 2, 3.

In the transverse direction (i.e. the direction of the Z-axis in FIG. 2), the two cladding layers and the guiding layer form a one dimensional waveguide which forces the laser to operate in the lowest order transverse mode. In the lateral direction, (i.e. the Y direction of FIGS. 1, 2, 3) as can be seen in FIG. 1, the guiding layer 111 is wider than the active layer 112. This is intended to limit gain to the region where the field of the fundamental lateral mode is nearly constant. Despite the fact that there is some guiding in the lateral direction (i.e. the guiding layer 111, is bounded laterally by the lower index of refraction cladding layer 113 as shown in FIG. 1), in general at high power, the laser 11 is wide enough to oscillate in the higher order lateral modes. Only when the laser 11 is coupled to the optical integrated circuit is stable operation in the fundamental lateral mode achieved.

As indicated above, the upper p-type cladding layer is divided into two portions 114 and 115. The electrode 214, which is connected to the cladding layer portion 114, provides the pumping current $I_{92}$ to the active layer 112 to control the laser gain. The contact 215, which is connected to the cladding layer portion 115, provides the current $I_\phi$. This current controls the carrier density in the guiding layer which in turn determines the round trip phase for radiation emitted in the active layer and propagating in the guiding layer. Thus, by adjusting the current $I_{100}$ the wavelength of radiation emitted by the laser 11 can be adjusted.

To supply feedback for the laser 11, the rear facet 231 is a reflecting facet. The front facet 232, which couples to the optical integrated circuit 11, is anti-reflection coated to avoid parasitic feedback resulting from reflection at the interface between the laser 11 and the optical integrated circuit 12. Instead, the optical integrated circuit includes grating structures and mirrors to provide the necessary feedback for the laser 11.

The laser 11 described above is a particular type of double heterostructure laser. However, the invention is not limited to this type of laser structure. Other types of laser structures may be utilized including, for example, buried heterostructure lasers, selectively diffused double heterostructure lasers, varying thickness double heterostructure lasers, and bent layer double heterostructure lasers. Other types of lasers such as quantum well devices may also be utilized in connection with the present invention. Illustratively, the lasers used in connection with the present invention may be formulated using the GaAs - AlGaAs materials system or the InP - InGaAsP materials system.

The structure of the optical integrated circuit 12 is now considered in more detail. The optical integrated circuit 12 comprises a slab waveguide core layer 121 illustratively made of $Si_3N_4$ approximately 1000 Angstroms° thick. The core layer 121 is surrounded by cladding layers 122 and 123 illustratively made of silica. The cladding layer 122 is formed on a silicon base 135. (See e.g. C. H. Henry et al "Low loss $Si_3N_4$ - $SiO_2$ Optical Waveguides on Si" Applied Optics Vol. 26, No. 13, July 1, 1987 pp. 2621–2624; H. J. Lee et al "Refractive-Index Dispersion of Phosphosilicate Glass, Thermal Oxide, and Silicon Nitride Films on Silicon" Journal of Applied Optics, Vol. 27, No. 19, Oct. 1, 1988 pp. 4104–4109). The guiding layer 111 of the laser is butt coupled directly to the core waveguide layer 121 in the optical integrated circuit. Thus, the optical axis of the core waveguide layer 121 is along the X-axis. The core waveguide layer does not extend all the way to the right end of the optical integrated circuit along the X axis to avoid a reflection from this end thereby avoiding non-wavelength selective parasitic feedback for the laser 11.

Embedded in the cladding layer 122, 123, are three second order grating structures. The grating structures 124, 126 are formed in the cladding layer 122 and the grating structure 125 is formed in the cladding layer 123. As shown in FIG. 1, the grating structures 124, 126 comprise alternating ridges and grooves which extend parallel to the Y axis. The grating structure 125 comprises alternating ridges and grooves which extend parallel to the X axis. More particularly, the ridges and grooves comprising the grating structures 124, 125, 126 are formed using thin (i.e. approximately 100 Angstroms°) corrugated layers of $Si_3N_4$.

The grating structure 124 has a period $a_1 = \lambda/n_{eff}$ (see FIG. 1), where $\lambda$ is the laser light wavelength in vacuum and $n_{eff}$ is the effective index of refraction for light propagating in the waveguide 121. The grating structure 125 has a period $a_2$. The period $a_2$ is chosen so that the stopbands provided by the gratings 124,125 for guided waves propagating in the X and Y directions are overlapped. The grating structure 126 has a period b (see FIG. 1) which is different from the period a by more than a laser gain spectrum width (i.e. approximately 200 Angstroms). The purpose of the grating structures 124, 125, 126 is discussed below.

In the optical integrated circuit 12, the cladding layer 123 is covered with a dielectric mirror 127. Under the cladding layer 122 is a birefringent plate 131. Two of the major axes of its dielectric tensor are in the plane X-Y and oriented at 45° to the X and Y axes. Illustratively, the plate 131 is formed from $TiO_2$ and this plate is attached to the silica body 130 of the optical integrated circuit 12. It should be noted that the silicon base 135 is removed in part so that the birefringent plate 131 is in direct optical communication with the silica body 130. The lower surface of the birefringent plate 131 is attached to a dielectric mirror 132. The dielectric mirrors 127, 132 along with the structures in between them form a vertical Fabry-Perot resonator. The optical axis of the Fabry-Perot resonator is along the Z-axis in FIGS. 1, 2, 3.

The operation of the laser 11 in combination with the optical integrated circuit 12 is now considered. First it should be noted that the grating structure 124 is a second order grating structure. This means that the first Fourier harmonic of the grating structure 124 does not provide Bragg reflection for light with a wavelength $\lambda = an_{eff}$ propagating from the laser. It may also be assumed that the ridges and grooves of the grating are equal and that the second Fourier harmonic providing conventional order grating structure with a period $a' = \lambda/2n_{eff}$ would provide reflection for a wavelength $2a'n_{eff}$ propagating from the laser. Such lasers are known as distributed Bragg reflector lasers. The feedback provided by the Bragg reflector with period $a' = \lambda/2n_{eff}$ is highly wavelength selective. See e.g. H. J. Lee et al "Narrow Bragg Reflector Filter" Applied Optics Vol. 27, No. 2, Jan. 15, 1988 pp. 211-213; H. J. Lee et al "Low Loss Bragg Reflectors on $SiO_2$-$Si_3N_4$-$SiO_2$ Rib Waveguides", Applied Optics, Vol. 26, No. 13, July 1, 1987, pp. 2618-2620.

In the present case the grating structure 124 with period $a_1 = \lambda/n_{eff}$ would normally provide radiation along the vertical or Z direction leading to an attenuation of the wave propagating along the X direction. However, because the grating structure 124 is located between the dielectric mirrors 127, 132, the grating structure 124 becomes a Bragg reflector.

A wave generated in the laser 11 propagates along the waveguide 121 and is vertically reflected by the grating 124 so that it couples via the grating 124 to a mode of the vertical Fabry-Perot resonator (FPR). The FPR mode couples back to the waveguide 121 via the same grating 124 and provides feedback for the laser. This feedback is similar to the conventional feedback used in a distributed feedback laser with a Bragg reflector in that the wave amplitude decreases exponentially along the X axis. However, in contrast to the first order Bragg reflector used in the distributed feedback laser, the stop bandwidth of the reflector formed by the grating structure 124 and the vertical Fabry-Perot resonator depends on the mistuning between the Bragg wavelength $an_{eff}$ and the resonant wavelength of the Fabry-Perot resonator. Preferably, through use of the phase tuning current $I_{100}$, the wavelength of the laser is chosen to be at one edge of or within the stopband of the reflector 124. The feedback for the laser 11 provided by the grating structure 124 in combination with the Fabry-Perot resonator is highly wavelength selective.

The grating structure 125 when combined with the vertical Fabry-Perot resonator has the same reflection properties along the Y axis as the grating structure 124 along the X-axis. As is shown below, it is the field distribution set up along the Y axis by the grating structure 125 which is related to the lateral mode of the laser 11.

The Fabry-Perot resonator is now considered in more detail. In the absence of the birefringent plate 131, many modes of the vertical Fabry-Perot resonator with different polarizations are possible. In such a case the grating structures 124 and 125 are coupled to different modes of the FPR with different polarizations and operate independently of each other. In this case, there are many competing lateral modes of the laser 11 and the situation is not different from a conventional broad area (i.e. laterally wide) laser.

In accordance with an illustrative embodiment of the present invention, the birefringent plate is used to insure that a particular resonant mode is excited in the Fabry-Perot resonator. Specifically, the thickness of the birefringent plate and the distance between the mirrors 127, 132 is chosen in such a way that the vertical Fabry-Perot resonator has a resonant mode at the wavelength $\lambda$. The excited mode is polarized in the X-Y plane at a forty-five degree angle to the X-Y axes along one of the major axes of the birefringent plate 131.

Both the grating structures 124 and 125 couple to this mode of the Fabry-Perot resonator. In this connection, it should be noted that it is the X component of the electric field which permits the Fabry-Perot resonator mode to couple to the grating structure 125.

The coupling of the excited Fabry-Perot resonator mode and the grating structure 125 excites nearly standing waves propagating in the Y direction in the waveguide 121. The amplitude envelope of these waves is same as the field distribution along the Y direction of the laser and thus determines the lateral mode of the laser. These standing waves are radiated from the edges of the waveguide 121 in the Y direction and give rise to power losses of the optical integrated circuit 12. The loss of each mode is proportional to its group velocity and is minimal for the lowest order lateral mode. Thus, the reflection coefficient for the lowest order (i.e. the fundamental) lateral mode is greater than that of the higher order lateral modes so that only the lowest order lateral mode is generated. Thus, by coupling to the optical integrated circuit 12, the laser 11 has the strongest feedback for the lowest order lateral mode, providing stable layer operation in this mode.

In FIGS. 1, 2, 3, the grating structure 126 provides output radiation in the form of a collimated beam. The period b of the grating structure 126 is chosen different from $a_1 = \lambda/n_{eff}$ to avoid feedback for the laser 11. Alternatively, the grating structure 126 may be omitted and the laser output may be obtained by making one of the dielectric mirrors 127, 132 partially transmissive.

It should be noted that the grating structures 124, 125 and birefringent plate 131 are designed to couple TE modes in the laser and in the vertical Fabry-Perot resonator. In an alternative embodiment of the invention it is possible to couple a TE mode to the grating structure 124 and a TM mode to the grating structure 125 to determine the lateral mode of the laser without using the birefringent plate 131. In this case the TE and TM modes have different effective indices of refraction $n_{eff}^{TE}$ and $n_{eff}^{TM}$, respectively. Thus, in this case, the grating period $a^{TE}$ of the grating structure 124 and the grating period $a^{TM}$ of the grating structure 125 have to satisfy the condition $a^{TE}n_{eff}^{TE} = a^{TM}n_{eff}^{TM}$.

Figure 4:
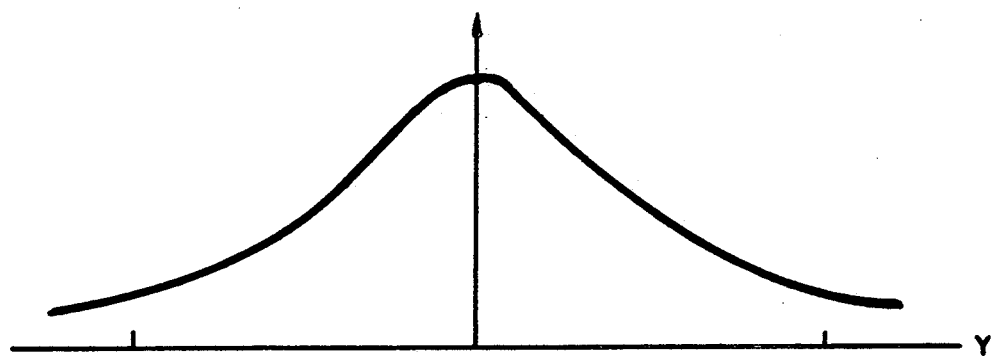
FIG. 4 shows the optical-electric field intensity distribution along the Y axis for the optical integrated circuit of FIGS. 1, 2 and 3.

In an illustrative embodiment of the invention, the grating 125 provides a strong coupling between the slab waveguide and FPR, and the grating 124 provides a weak coupling between them. A strong coupling means that the field reflection coefficient from a single line multiplied by the number of lines is greater than 1 (typically 2-10). A weak reflection means that this product is less than 1 (typically 0.5-0.1). The strong coupling provided by the grating 125 forms a compound resonator (CR) comprising the guiding layer 121 and the Fabry Perot resonator. Losses of modes of this resonator due to radiation from the edges of the waveguide 121 in Y direction strongly depend on the mode number and are minimal for the fundamental mode. Because of the weak coupling provided by the grating 124 the wave propagating along X direction in the slab waveguide has a small reflection coefficient in the most cases. The reflection coefficient is significant only if this wave can excite a mode of CR. The coupling coefficient between the wave propagating in X direction and a CR mode is significant only if the field distribution in this wave along Y direction is essentially the same as that of CR mode. On the other hand total losses are minimal for the fundamental CR mode which distribution is schematically shown in FIG. 4. Thus the fundamental lateral mode has the maximal reflection (maximal feedback).

When the incident field of the waveguide is at the resonance frequency, a strong field builds up in CR. This accumulated energy is coupled back into the waveguide in both directions. The reinjected field in the forward direction destructively interferes with the incident field. When the resonator loss is dominated by coupling, this destructive interference is nearly complete and according to the power conservation all power is reflected back to the laser. (See e.g., R. F. Kozerinov et al., IEEE J. Quantum Electronics, Vol. QE-23, No. 9, Sept. 1987).

Figure 5:
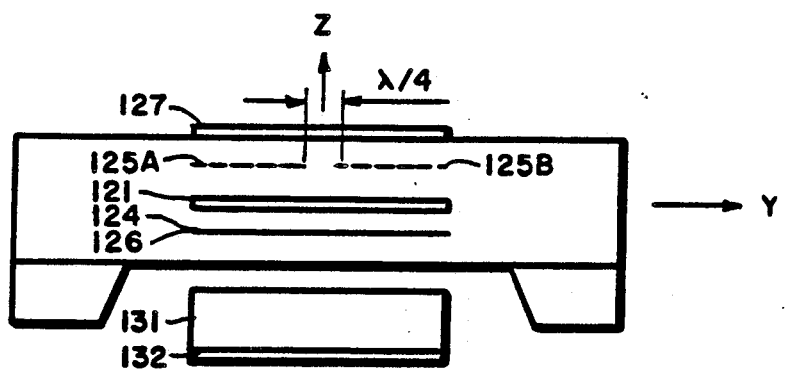
FIG. 5 shows an alternative optical integrated circuit for enabling a semiconductor laser to achieve stable fundamental lateral mode operation at high power, in accordance with an alternative illustrative embodiment of the invention.

In an alternative embodiment of the invention, shown in FIG. 5, the grating 125 is replaced by two patches 125A and 125B of grating shifted with respect to each other by a quarter wavelength (FIG. 5). Combined with the slab waveguide 121 these patches form a quarter wavelength phase shifted resonator. The operating principle is the same as that of the preceding embodiment. The only difference is that CR in this case has only one resonant mode.

Figure 6:
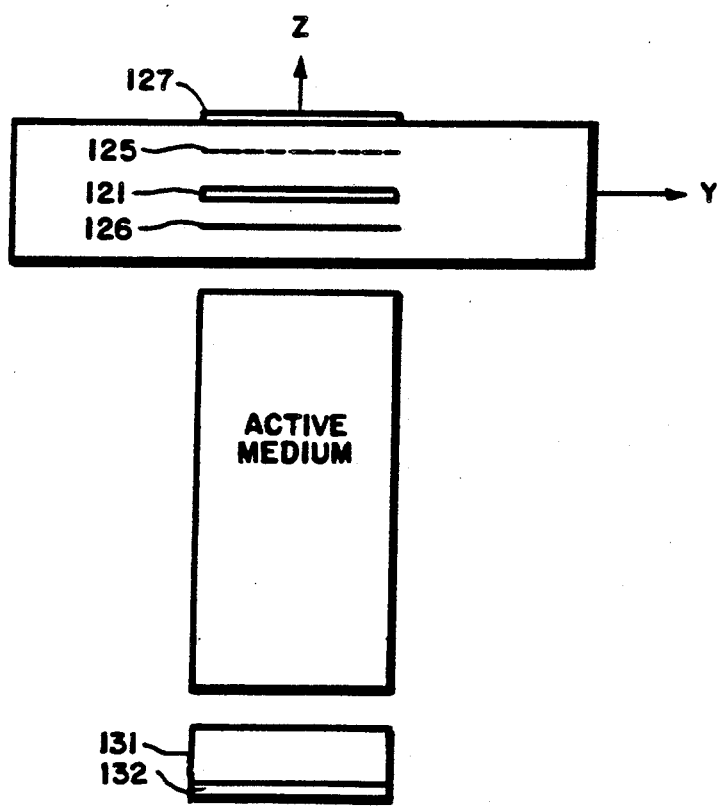
FIG. 6 shows an alternative us for the optical integrated circuit of the present invention.

The optical integrated circuit described above can be used for a transverse mode selection in gas lasers or solid state lasers like YAG:Nd. In this case the active medium is placed between the mirrors of the Fabry Perot resonator as shown in FIG. 6. In this case both gratings 124 and 125 strongly couple the Fabry Perot resonator with the slab waveguide.

Finally, the above described embodiments of the invention are intended to be illustrative only. Numerous alternative embodiments may be devised by those skilled in the art without departing from the spirit and scope of the following claims.

For example, a plurality of optical integrated circuits, each with an associated laser, can be stacked in a single Fabry-Perot resonator to increase the output power. In such a case, the optical integrated circuit can be modified such that all lasers generating waves propagating in the X direction are connected optically with a single birefringent plate and a single grating (125) forming a second order Bragg reflector for waves propagating in the Y direction.

I claim:

1. In combination
   a semiconductor laser for emitting radiation which propagates along an optical axis of said laser,
   a resonator having an optical axis oriented perpendicular to the optical axis of said laser, and
   an optical integrated circuit coupled to said laser, said optical integrated circuit comprising means for coupling radiation emitted in said laser to a particular resonant mode of said resonator to cause said laser to operate stably in the lowest order lateral mode.

2. The combination of claim 1 wherein said laser is a double heterostructure laser.

3. The combination of claim 1 wherein said optical integrated circuit comprises a core waveguide layer directly coupled to said laser and having an optical axis which is aligned with the optical axis of said laser and first and second cladding layers surrounding said core waveguide layer.

4. The combination of claim 3 wherein said coupling means comprises first grating structure located in first cladding layer and second grating structure located in second said cladding layer.

5. The combination of claim 4 wherein said resonator comprises first dielectric mirror located adjacent to said first cladding layer and second dielectric mirror located adjacent to said second cladding layer, said integrated circuit between said dielectric mirrors.

6. The combination of claim 5 wherein said resonator further includes a birefringent plate located between said first cladding layer and said first dielectric mirror.

7. The combination of claim 4 wherein said first and second grating structures are located in said first and second cladding layers, respectively, and are oriented orthogonally to each other.

8. The combination of claim 4 wherein said first grating structure is formed in said first cladding layer and comprises ridges and grooves extending in the lateral direction of said laser and wherein said second grating structure is formed in said second cladding layer and comprising ridge and grooves extending parallel to the optical axis of the laser.

9. The combination of claim 4 herein said combination includes an additional grating structure located in said first cladding layer between said first grating structure and said laser, for coupling a fraction of said radiation outside of said combination.

10. The combination of claim 5 wherein at least one of said dielectric mirrors is partially transmissive.

11. In combination,
a semiconductor laser for emitting radiation which propagates along an optical axis of said laser,
cleaved mirror at one side of said laser comprising the first part of a resonator for said laser,
core waveguide layer directly coupled to the side of said laser opposite to said cleaved mirror and having an optical axis which is aligned with the optical axis of said laser,
first and second cladding layers surrounding said core waveguide layer,
a resonator having an optical axis oriented perpendicular to the optical axis of said layer, and
first and second orthogonal grating structures located in the first and second said cladding layer respectively for coupling light emitted by said laser to a resonat mode of said resonator and comprising with said core waveguide layer and said resonator the second part of the resonator for said laser to cause said laser to operate in the fundamental lateral mode.

12. A device including an optical integrated circuit for causing a semiconductor laser to operate in a fundamental lateral mode comprising
a core waveguide layer having an optical axis which can be aligned with the optical axis of said laser, said core waveguide layer being bounded by first and second cladding layers,
first and second reflecting means for defining a resonator having an optical axis oriented perpendicular to said optical axis of said core waveguide layer, and
first and second grating structures formed adjacent to said core waveguide layer for coupling radiation emitted in said laser to a particular mode of said resonator to cause said laser to operate in the fundamental lateral mode.

13. In combination
a laser for emitting light which propagates along an optical axis of the laser,
a resonator coupled to said laser and having an optical axis oriented perpendicularly to the optical axis of the laser, and
a grating structure coupled to the laser and the resonator for causing the electric field distribution in a direction perpendicular to both said optical axes for said laser and said resonator to be a fundamental mode.

14. The device of claim 12 wherein one of said grating structures is weakly coupled to said core waveguide layer and one of said grating structures is strongly coupled to said core waveguide layer.

15. A device including an optical integrated circuit comprising
a core waveguide layer bound by first and second cladding layers, said core waveguide layer having an optical axis,
first and second reflecting means for defining a resonator having an optical axis oriented perpendicular to said optical axis of said core waveguide layer, and
first and second grating structures formed adjacent to said core waveguide layer for causing a particular mode to be excited in said resonator.

16. The device of claim 15 wherein said resonator includes an active medium.

* * * * *